(12) United States Patent
Hwang et al.

(10) Patent No.: US 9,884,340 B2
(45) Date of Patent: Feb. 6, 2018

(54) DEPOSITION APPARATUS AND METHOD WITH COOLER

(71) Applicant: SAMSUNG DISPLAY CO., LTD., Yongin-si, Gyeonggi-do (KR)

(72) Inventors: Jae Hoon Hwang, Seoul (KR); Kwan Hee Lee, Suwon-si (KR)

(73) Assignee: Samsung Display Co., Ltd., Yongin-si, Gyeonggi-do (KR)

( * ) Notice: Subject to any disclaimer, the term of this patent is extended or adjusted under 35 U.S.C. 154(b) by 95 days.

(21) Appl. No.: 14/963,461

(22) Filed: Dec. 9, 2015

(65) Prior Publication Data

US 2017/0014861 A1    Jan. 19, 2017

(30) Foreign Application Priority Data

Jul. 17, 2015    (KR) .................. 10-2015-0101407

(51) Int. Cl.
*C23C 14/12*    (2006.01)
*B05D 1/00*    (2006.01)

(52) U.S. Cl.
CPC ..................... *B05D 1/60* (2013.01)

(58) Field of Classification Search
CPC .............. C23C 16/448; C23C 16/4485; C23C 14/0021; C23C 14/0026; C23C 14/12; C23C 14/22
See application file for complete search history.

(56) References Cited

U.S. PATENT DOCUMENTS

| | | | | |
|---|---|---|---|---|
| 3,953,343 A | * | 4/1976 | Sliney | C10M 7/00 508/104 |
| 2004/0200416 A1 | * | 10/2004 | Schuler | C23C 14/243 118/723 E |
| 2006/0144325 A1 | * | 7/2006 | Jung | C23C 14/042 117/105 |
| 2006/0146329 A1 | * | 7/2006 | Jung | G03F 7/70791 356/401 |
| 2006/0147613 A1 | * | 7/2006 | Hwang | C23C 14/042 427/9 |
| 2006/0147628 A1 | * | 7/2006 | Hwang | C23C 14/243 427/248.1 |

(Continued)

FOREIGN PATENT DOCUMENTS

| | | |
|---|---|---|
| KR | 10-2008-0096451 A | 10/2008 |
| KR | 10-2012-0026135 A | 3/2012 |
| KR | 10-2015-0012504 A | 2/2015 |

(Continued)

OTHER PUBLICATIONS

Costa, Jose C.S., et al., "Description and Test of a New Multilayer Thin Film Vapor Deposition Apparatus for Organic Semiconductor Materials". J. Chem. Eng. Data, 2015, 60, 3776-3791.*

(Continued)

*Primary Examiner* — Bret P Chen
(74) *Attorney, Agent, or Firm* — Lee & Morse, P.C.

(57) ABSTRACT

A deposition apparatus and method for depositing an organic material includes an effusion cell, a guide rail, and a cooling channel. The effusion cell extends in a first direction. The guide rail is below the effusion cell and extends in a second direction. The cooling channel is below an upper surface of the guide rail and extends in the second direction.

9 Claims, 11 Drawing Sheets

(56) References Cited

U.S. PATENT DOCUMENTS

2008/0284768 A1* 11/2008 Yoshida .............. G09G 3/2022
    345/208
2011/0220802 A1* 9/2011 Frisch .................... G01T 1/208
    250/363.03

FOREIGN PATENT DOCUMENTS

| KR | 10-2015-0012514 A | 2/2015 |
| KR | 10-2015-0030547 A | 3/2015 |

OTHER PUBLICATIONS

Yoshinobu, Jun, et al., "A miniature effusion cell for the vacuum deposition of organic solids with low vapor pressures in surface science studies". Review of Scientific Instruments, 79, 076107 (2008), pp. 1-2.*

Bauer, A., et al., "Ultra-high vacuum compatible preparation chain for intermetallic compounds". Review of Scientific Instruments 87, 113902 (2016), pp. 1-11.*

* cited by examiner

DEPOSITION APPARATUS AND METHOD WITH COOLER

CROSS-REFERENCE TO RELATED APPLICATION

Korean Patent Application No. 10-2015-0101407, filed on Jul. 17, 2015, and entitled: "Deposition Apparatus," is incorporated by reference herein in its entirety.

BACKGROUND

1. Field

One or more embodiments described herein relate to a deposition apparatus.

2. Description of the Related Art

A variety of flat panel displays have been developed. Examples include a liquid crystal display (LCD) and an organic light emitting diode (OLED) display. An OLED display has improved luminance, viewing angle, and thinness compared with LCD displays. An OLED display is also self-emissive in that it does not require a backlight.

An OLED display may be fabricated using physical vapor deposition methods (e.g., vacuum deposition, ion plating, or sputtering methods) or chemical vapor deposition methods according to gas reaction. For example, the organic layer may be formed using a vacuum deposition method, which involves depositing an organic material on a substrate by evaporation in a vacuum. The organic material may be effusion cell sprayed onto the substrate. The effusion cell may include a crucible that receives an organic material and a heating element for heating the crucible.

In an attempt to form substrates of increased size and organic layers with good step coverage and uniformity, the effusion cell may be used to provide organic gaseous material. This material may be formed by evaporating organic material on the substrate held in a stationary state. The effusion cell may move in a vacuum chamber relative to the substrate. A guide rail may be installed to guide movement of the effusion cell, and the slide member may move along the guide rail.

Grease may be used to reduce friction between the guide rail and slide member. However, when the grease is heated during evaporation of the organic material and when the slide member moves, the evaporation gas may be contaminated in the chamber by the heated grease. The contaminated gas may reduce the lifespan of the OLED display. In addition, the requirement to resupply the grease causes delays and inefficiencies in the manufacturing process.

SUMMARY

In accordance with one or more embodiments, a deposition apparatus includes an effusion cell extending in a first direction; a guide rail below the effusion cell and extending in a second direction intersecting the first direction; and a cooling channel below an upper surface of the guide rail and extending in the second direction. The cooling channel may be in an interior of the guide rail. The guide rail may include a first opening connected to a first end of the cooling channel and a second opening connected to a second end of the cooling channel. The first opening may be at a first end of the guide rail in the second direction, and the second opening may be at a second end of the guide rail in the second direction.

The first opening and the second opening may be at a first end of the guide rail in the second direction, and the cooling channel may include a first extension portion extending from the first opening to a second end of the guide rail, and a second extension portion bent from the first extension portion, extending to a first end of the guide rail, and connected to the second opening.

The deposition apparatus may include a cooler below the guide rail or at a side portion of the guide rail, wherein the cooling channel is in the cooler. The cooling channel may have a substantially helical shape. The deposition apparatus may have a slide between the effusion cell and the guide rail, wherein a lower surface of the slide faces the guide rail and the upper surface of the guide rail facing the slide are combined with each other.

The deposition apparatus may include a lubricating surface on the guide rail. The lubricating surface includes an organic material containing fluoride. The deposition apparatus may include a substrate holder above the effusion cell and on which a target substrate is mounted; and a mask assembly fixed at a position adjacent to the target substrate. A width of the effusion cell may cover a width of the target substrate in the first direction, and a width of the effusion cell may be narrower than a width of the target substrate in the second direction.

In accordance with one or more other embodiments, a method for depositing an organic material includes providing an effusion cell, extending in a first direction, on a guide rail extending in a second direction intersecting the first direction; supplying a refrigerant to a cooling channel adjacent to an upper surface of the guide rail; and moving the effusion cell on the guide rail. Moving the effusion cell may include moving the effusion cell while a deposition material is evaporated from the effusion cell. Moving the effusion cell may include moving the effusion cell while the refrigerant continuously flows in the cooling channel.

The guide rail may include a lubricating surface having an organic material containing fluoride. The cooling channel may be in an interior of the guide rail. The cooling channel maybe in a cooler below the guide rail or at a side portion of the guide rail. The cooling channel may have a substantially helical shape.

BRIEF DESCRIPTION OF DRAWINGS

Features will become apparent to those of skill in the art by describing in detail exemplary embodiments with reference to the attached drawings in which:

FIG. 5 illustrates another embodiment of a deposition apparatus;

DETAILED DESCRIPTION

Figure 1:
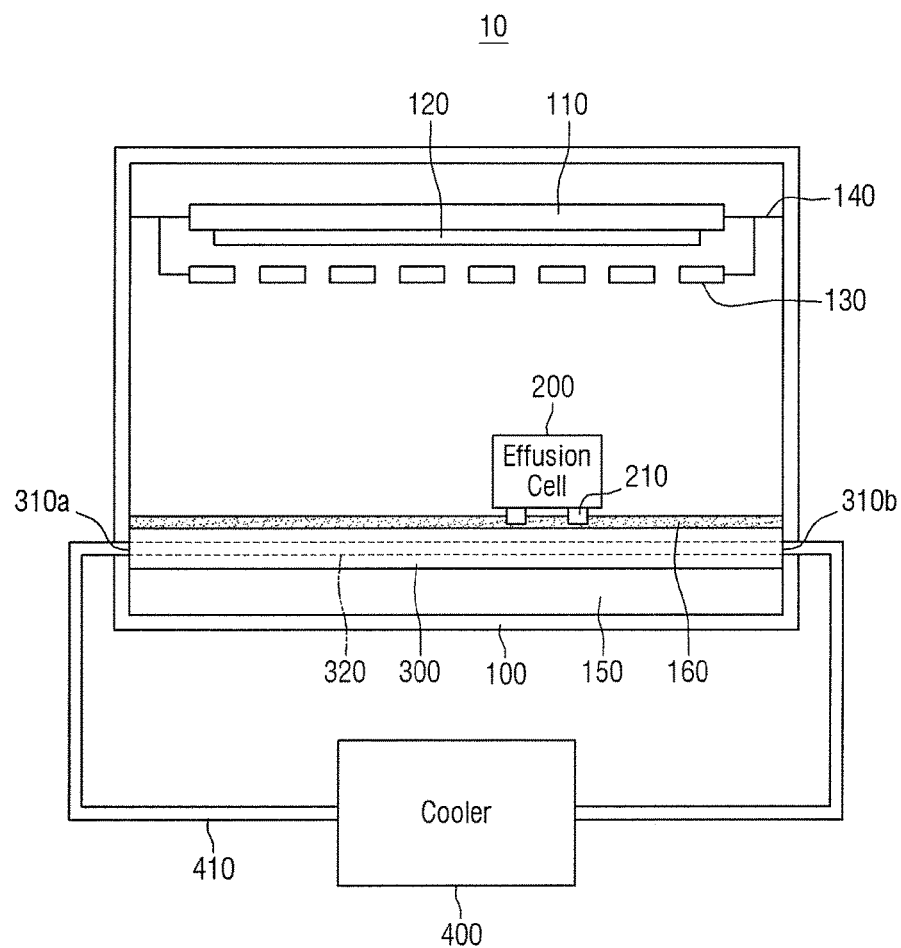
FIG. 1 illustrates an embodiment of a deposition apparatus.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will convey exemplary implementations to those skilled in the art. The embodiments may be combined to form additional embodiments.

It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Figure 2:
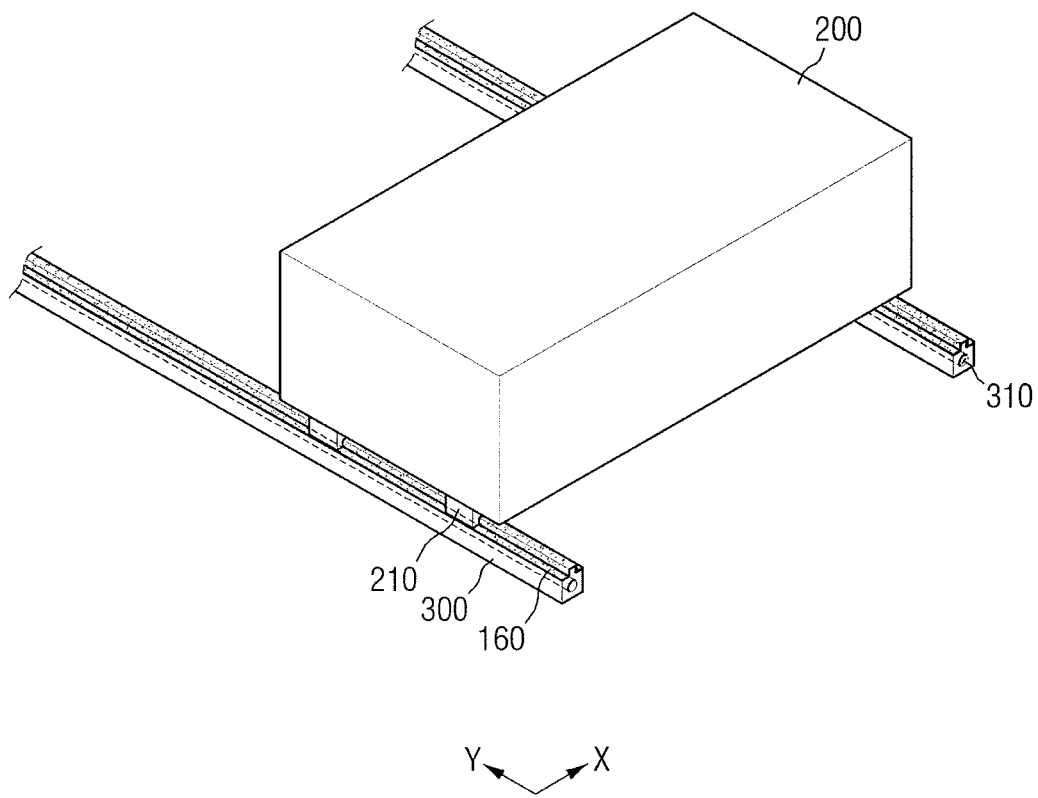
FIG. 2 illustrates another view of the deposition apparatus.
Figure 3:
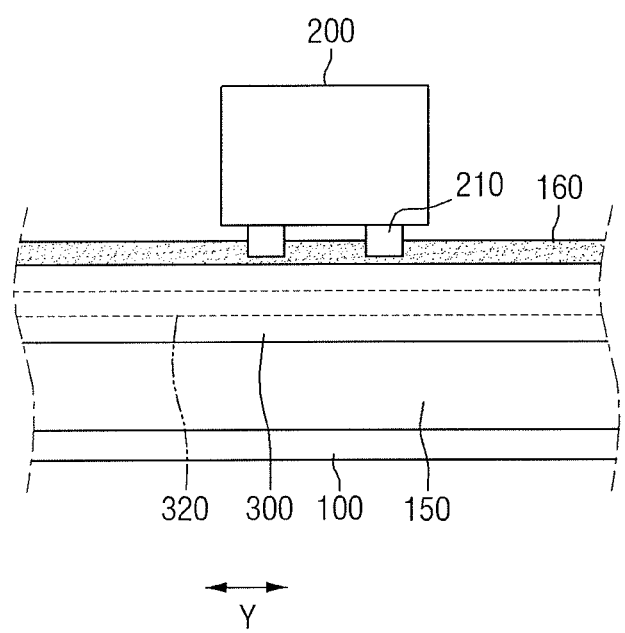
FIG. 3 illustrates a sectional view of the deposition apparatus.
Figure 4:
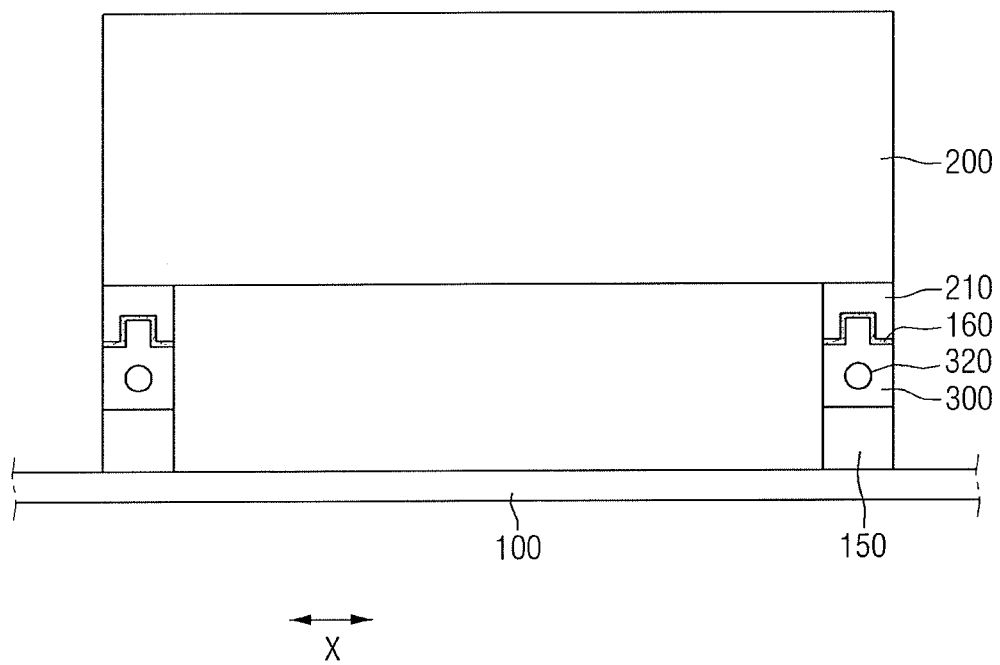
FIG. 4 illustrates another sectional view of the deposition apparatus.

FIG. 1 illustrates a cross-sectional view of an embodiment of a deposition apparatus 10. FIG. 2 illustrates a perspective view of the deposition apparatus 10. FIG. 3 illustrates a cross-sectional view taken in a first (e.g., Y) direction of the deposition apparatus 10. FIG. 4 is a cross-sectional view in a second (e.g., X) direction of the deposition apparatus 10.

Referring to FIGS. 1 to 4, the deposition apparatus 10 includes a chamber 100, an effusion cell 200 in the chamber, a guide rail 300 below the effusion cell 200, and a cooler 400 adjacent to the guide rail 300. The chamber 100 receives a target substrate 120 and provides space for performing a deposition process on the target substrate 120. The interior of the chamber 100 is exposed to a vacuum. The deposition apparatus 100 may include a vacuum line with a vacuum pump to apply a vacuum to the interior of the chamber 100.

The target substrate 120 may be, for example, an insulating substrate or a semiconductor substrate. In an exemplary embodiment, the target substrate 120 may be a substrate used in an organic light emitting diode (OLED) display device. The structure of the target substrate 120 may vary depending on a step to which a deposition process is applied during a manufacturing process of the OLED display device. For example, when the deposition process is a hole injection layer forming process, the target substrate may be a substrate provided with a pixel defining layer and an anode electrode. When the deposition process is an organic light emitting layer forming process, the target substrate may be a substrate provided with a hole injection layer and/or a hole transport layer, as well as the pixel defining layer and the anode electrode.

A substrate holder 110 and a fixing member 140 may be within the chamber 100. The substrate holder 110 allows the target substrate 120 to be mounted thereon. The substrate holder 110 may be in an upper portion inside the chamber 100, and the target substrate 120 may be mounted on a lower portion of the substrate holder 110.

The substrate holder 110 may contain a magnetic material. For example, when the substrate holder 110 contains a material having magnetism (e.g., magnet or electromagnet) and a mask assembly 130 includes a metal, the mask assembly 130 may be fixed by magnetic force between the substrate holder 110 and the mask assembly 130.

The fixing member 140 may fix the substrate holder 110 to the interior of the chamber 100. In addition, the fixing member 140 may assist in fixing the target substrate 120. Further, the fixing member 140 may assist the fixing the mask assembly 130 while maintaining a constant distance between the mask assembly 130 and the target substrate 120. The fixing member 140 may have an attachable and detachable frame structure.

The mask assembly 130 may define a region on which a material evaporated from the effusion cell 200 is deposited. The mask assembly 130 may include a mask portion and an opening. The opening may expose the target substrate 120 and allow the material evaporated from the effusion cell 200 to be deposited on a corresponding region. The mask portion may cover the target substrate 120 to prevent the material evaporated from the effusion cell 200 from being deposited on the corresponding region. Thus, the material deposited through the mask assembly 130 may have a predetermined pattern.

The mask assembly 130 may be a mask (e.g., a fine metal mask (FMM)) or may be configured to include a plurality of masks. The mask assembly 130 may be adjacent to the target substrate 120 to be fixed. As described above, the distance between the mask assembly 130 and the target substrate 120 may be adjusted by the substrate holder 110 and the fixing member 140.

The effusion cell 200 may provide a material to be deposited (hereinafter, 'a deposition material'). The deposition material may be an organic material, for example, an organic material for an organic light emitting layer. As another example, the deposition material may be an organic material for a hole injection layer, a hole transport layer, an electron transport layer, or an electron injection layer. In addition, various organic materials may be used as the deposition material. In one embodiment, the effusion cell 200 may contain a plurality of different organic materials.

The effusion cell 200 may be opposed to the target substrate 120 in the chamber 100. When the substrate holder 110 is in the upper portion inside the chamber 100, the effusion cell 200 may be in a lower portion inside the chamber 100.

The effusion cell 200 may include a crucible for storing the organic material therein, a heater for heating the crucible, and a spraying nozzle for spraying the organic material. The crucible may store the organic material in a solid state. The heater may serve to heat and evaporate the organic material. The heater may be, for example, a resistance-type heater. The spraying nozzle may be opened toward the target substrate 120 to emit evaporated organic material to the target substrate 120.

The effusion cell 200 may have, for example, a linear shape extending in a first direction (X), e.g., the effusion cell 200 may be a linear effusion cell. The width of the effusion cell 200 may cover or correspond to the width of the target substrate 120 in the first direction X. For example, the effusion cell 200 ma cover all regions on which the organic material is deposited in the target substrate 120 in a width direction. In this case, deposition may be performed on all the deposition regions of the target substrate 120 in the first direction X, even if the effusion cell 200 does not move in the first direction X.

The effusion cell 200, e.g., a linear effusion cell, may be integrally formed in the first direction X. In one embodiment, a plurality of dot-like effusion cells may be adjacent to each other in the first direction X to implement a linear effusion cell. In addition, a plurality of arrangements of integral linear effusion cells or dot-like effusion cells configuring a linear shape overall may be disposed in a second direction (Y) intersecting (e.g., perpendicular to) the first direction X. In this case, the width of the effusion cell 200 in the second direction Y may be increased. Additionally, or alternatively, in the case, the width of the effusion cell 200 may be narrower than a width of the target substrate 120 in the second direction Y, and may not cover the entirety of the width of the target substrate 120 in the second direction Y.

In order to perform deposition on the entirety of the width of the target substrate 120 in the second direction Y, the deposition apparatus 10 may move the effusion cell 200 in the second direction Y. In one embodiment, a slide member 210 and the guide rail 300 may be used to move the effusion cell 200 in the second direction Y.

The guide rail 300 may be below the effusion cell 200 and extend in the second direction Y. The length of the guide rail 300 may be identical to or greater than that of the target substrate 120 in the second direction Y. In one embodiment, a plurality of guide rails may be provided, e.g., two guide rails 300 spaced from each other in parallel. The two guide rails 300 may be spaced so that they overlap respective ends of the effusion cell 200 in the first direction X.

The slide member 210 may be on a lower surface of the effusion cell 200. The slide member 210 may be attached or coupled to the lower surface of the effusion cell 200. In another exemplary embodiment, the slide member 210 may be integrally combined with the effusion cell 200 or a case for receiving the effusion cell 200.

The slide member 210 may be placed on the guide rail 300. When two guide rails 300 overlap the ends of the effusion cell 200 in the first direction X, a plurality of slide members 210 may be provided. The slide members 201 may be at respective ends of the effusion cell 200 in the first direction X. In this case, one slide member 210 may be disposed on each end of the effusion cell 200 in the first direction X. In another embodiment, a plurality of slide members 210 may be disposed on each end of the effusion cell 200 in the first direction X. For example, as illustrated in FIG. 2, two slide members 210 may be provided on the same end of the effusion cell 200 and spaced apart from each other in the second direction Y. In a similar manner, two slide members 210 may be provided on the other end of the effusion cell 200 and spaced apart from each other in the second direction Y.

The slide member 210 may be placed on the guide rail 300 to support the effusion cell 200 and guide the effusion cell 200 while moving in a length direction of the guide rail 300.

A lower surface of the slide member 210 facing the guide rail 300 and an upper surface of the guide rail 300 facing the slide member 210 may include uneven surfaces that are combined with each other. For example, the upper surface of the guide rail 300 may include a protrusion protruding upwardly and the lower surface of the slide member 210 may include a recess recessed upwardly and combined with the protrusion of the guide rail 300. As a result of this arrangement, the slide member 210 may not be separated from the guide rail 300 and may move thereon.

A lubricating surface 160 may be on the guide rail 300. The lubricating surface 160 decreases friction between the guide rail 300 and the slide member 210. The lubricating surface 160 may include an organic material containing fluoride as a smoothing material. In one embodiment, the lubricating surface 160 may include grease applied to the guide rail 300. The grease may allow the slide member 210 to smoothly slide and move on the guide rail 300.

A support member 150 may be on a lower portion of the guide rail 300 to support the guide rail 300. One surface of the support member 150 may be attached to a bottom surface of the chamber 100 and another surface may be attached to the guide rail 300. The number of the support members 150 may correspond to the number of the guide rails 300 and may extend parallel to the guide rail 300 in the second direction Y.

The guide rail 300 may include a cooling channel 320, including an internal portion filled with a refrigerant (e.g., cooled water). The cooling channel 320 may be adjacent to an upper surface of the guide rail 300 and serves to decrease the temperature of the upper surface of the guide rail 300. The cooling channel 320 may be a vacant space filled with the refrigerant, and may be elongated and extend in the second direction Y in the interior of the guide rail 300. The cooling channel 320 may be connected to a first opening 310*a* in one end of the guide rail 300 and a second opening 310*b* in the other end of the guide rail 300 in the second direction Y. The first opening 310*a* may be an inlet through which the refrigerant is introduced into the cooling channel 320. The second opening 310*b* may be an outlet to discharge the refrigerant from the cooling channel 320.

The cooler 400 may include a refrigerant supplying source outside the chamber 100 to supply the guide rail 300 with refrigerant. The cooler 400 and the guide rail 300 may be connected to each other via a cooling hose 410. The cooling hose 410 is connected to the first opening 310*a* and the second opening 310*b* of the guide rail 300 from the cooler 400. The refrigerant may be a fluid such as water, air, gas, or another refrigerant.

The cooler 400 may include a cooling tank for storing the refrigerant, a heat exchanger for cooling the refrigerant, and a pump for providing the refrigerant. The refrigerant cooled in the cooler 400 may be introduced into the first opening 310*a* of the guide member 300 via the cooling hose 410, and may pass through the cooling channel 320 in the interior of the guide rail 300. The refrigerant passes through the cooling channel 320 to decrease the temperature of the guide rail 300, thereby preventing defects from occurring during the manufacturing process.

An embodiment of a method for depositing organic material using the deposition apparatus 10 will now be explained. The target substrate 120 may be fixed to the substrate holder 110, and the mask assembly 130 may be below the target substrate 120. The effusion cell 200 may be below the target substrate 120 and above the guide rail 300 through the slide member 210. The lubricating surface 160 (e.g., grease) may be applied to the upper surface of the guide rail 300, with the lubricating surface 160 between the slide member 210 and the guide rail 300. In an initial step, the effusion cell 200 may be at one end of the guide rail 300 to cover one side of the target substrate 120.

Then, the heater of the effusion cell 200 may be operated to evaporate the organic material in the crucible. The evaporated organic material may rise and be deposited on the target substrate 120 via the opening of the mask assembly 130.

When the effusion cell 200 is in one end of the guide rail 300, the organic material may be mainly deposited on only one side of the target substrate 120. Thus, the effusion cell 200 may move in the second direction Y to deposit the organic material over the entirety (or at predetermined locations less than the entirety) of the target substrate 120.

In an exemplary embodiment, the effusion cell 200 may continuously move in a state in which the organic material is evaporated. The rate of movement of the effusion cell 200 may be uniform or may be at another predetermined rate depending, for example, on a deposition pattern for the target substrate.

In another exemplary embodiment, after the effusion cell 200 performs deposition at an initial position for a predetermined time, the effusion cell 200 may move a predetermined distance in the second direction Y, and may then be stopped. The effusion cell 200 may then perform deposition again for a predetermined time. Such an operation may be repeated while the effusion cell 200 moves in the second direction Y, until the entirety (or a predetermined area) of the target substrate 120 is covered When the effusion cell 200 moves along the guide rail 300, the lubricating surface 160 between the slide member 210 and the guide rail 300 may decrease friction therebetween and may help the effusion cell 200 to smoothly move on the guide rail 300. By using the lubricating surface 160, the degree of friction may be decreased, but the occurrence of certain friction due to the movement of the effusion cell 200 may not be completely prevented. As a result, certain frictional heat might be generated under these circumstances. In addition, when the heater is operated to evaporate the organic material in the effusion cell 200, temperature in the interior of the effusion cell 200 and the chamber 100 may increase.

The grease, that may be used as the lubricating surface 160, may contain fluoride. When the temperature in the interior of the chamber 100 increases, the fluoride in the grease may evaporate into an internal space of the chamber 100. The evaporation amount of fluoride may be in proportion to the temperature in the interior of the chamber 100. The fluoride reacts with an organic material already formed on the target substrate 120, as well as the organic material to be deposited, and may degrade device characteristics.

It was experimentally confirmed that when the target substrate on which an organic light emitting layer was deposited was left alone within the chamber 100 at a temperature of 100° C. for 30 minutes, an initial lifespan of the organic light emitting layer rapidly decreased. As a result, the lifespan decreased by 90% within one hour as compared to a substrate not having been left in the interior of the chamber 100. In an other instance. when the target substrate on which an organic light emitting layer was deposited was on standby within the chamber 100 at a temperature of 50° C. for 30 minutes, the lifespan decreased by 50% within one hour, compared to a substrate not having been left in the interior of the chamber 100.

Meanwhile, it could be confirmed that when the target substrate on which an organic light emitting layer was deposited was on standby within the chamber 100 at a room temperature of 20° C., the lifespan did not decrease compared to a substrate not having been left in the interior of the chamber 100. Thus, it could be confirmed that maintaining the interior of the chamber 100 at a relatively low temperature may be helpful in maintaining the lifespan of a device.

However, in order to evaporate the organic material from the effusion cell 200, a heating process is unavoidable. Thus, it may be practically difficult to adjust the temperature of the entire interior of the chamber 10 to room temperature. As previously indicated, when the lubricating surface 160 is heated, impurities are evaporated and degradation in device characteristics results. This defect may be solved by maintaining the temperature of the lubricating surface 160 at a relatively low temperature.

For example, a refrigerant (such as cooled water) may be circulated through the cooling channel 320 inside the guide rail 300. As a result, an increase in the temperature of the guide rail 300 may be restrained, and accordingly an increase in the temperature of the lubricating surface 160 on the guide rail 300 may be restrained. Thus, evaporation of fluoride from the lubricating surface 160 may be restrained, to thereby prevent degradation in device characteristics.

In this respect, refrigerant may be supplied to the cooling channel 320 during a time at least when the effusion cell 200 moves on the guide rail 300. Even when the effusion cell 200 does not move, when refrigerant is supplied to the cooling channel 320, an increase in the temperature of the guide rail 300 may be restrained. Further, when the refrigerant flows in the internal portion of the cooling channel 320 by continuously supplying the refrigerant from the first opening 120a, an increase in temperature of the refrigerant itself may be restrained. As a result, relatively low temperatures of the guide rail 300 and the lubricating surface 160 may be maintained.

Figure 5:
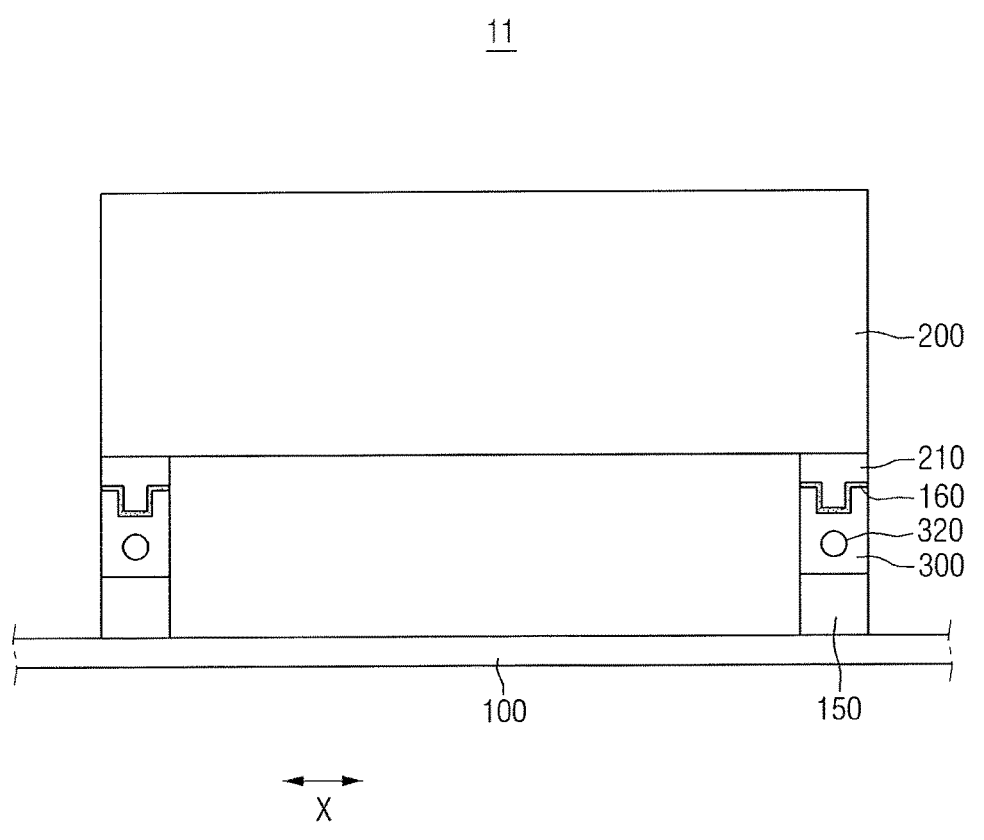

FIG. 5 is a cross-sectional view of another embodiment of a deposition apparatus 11. This embodiment is identical to the embodiment of FIG. 4, with several exceptions. For example, like the embodiment of FIG. 4, a lower surface of a slide member 211 facing a guide rail 301 and an upper surface of the guide rail 301 facing the slide member 211 include uneven surfaces that are combined with each other.

However, unlike the embodiment in FIG. 4, the upper surface of the guide rail 301 includes a recess recessed downwardly and the lower surface of the slide member 211 includes a protrusion protruding downwardly. The slide member and the guide member may have shapes opposite to, but operation substantially in the same manner as, those in FIG. 4.

Figure 6:
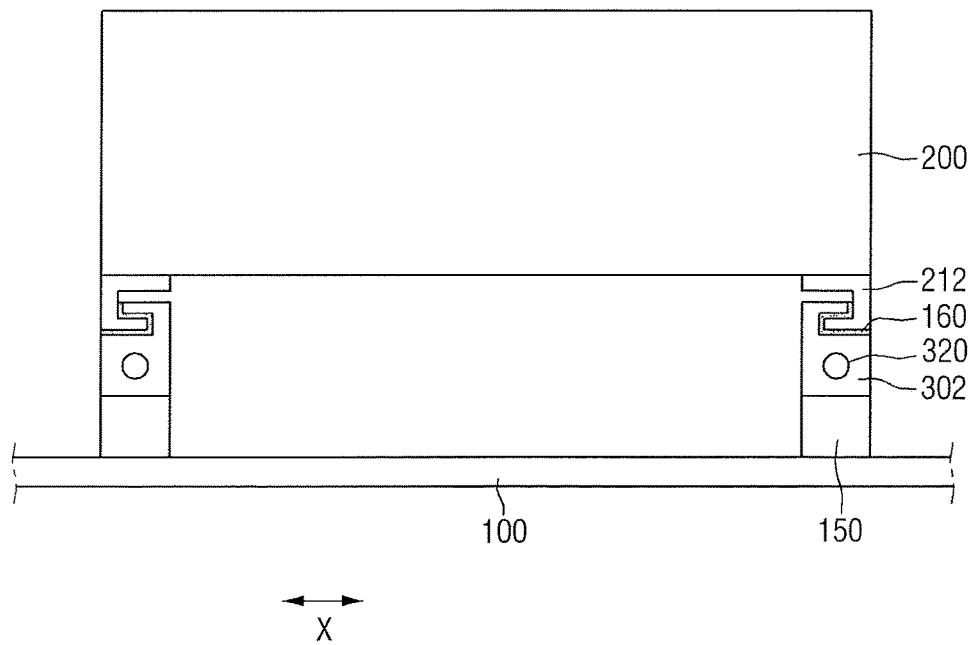
FIG. 6 illustrates another embodiment of a deposition apparatus.

FIG. 6 is a cross-sectional view of another embodiment of a deposition apparatus 12 which is different from the deposition apparatus 10 of FIG. 4 in that each of a slide member 212 and a guide rail 302 includes a protrusion bent at a right angle. The slide member 212 may have a shape protruding downwardly and bent inwardly, and the guide rail 302 may have a shape protruding upwardly and bent outwardly. The protruding and bent shapes of the slide member 212 and the guide rail 302 may be arranged to engage each other. An upper surface, a side surface, and a lower surface of an inwardly bent portion of the slide member 212 may be surrounded by guide rail 302.

In another exemplary embodiment, the slide member 212 may have a shape protruding downwardly and bent outwardly, and the guide rail 302 may have a shape protruding upwardly and bent inwardly.

as indicated, the deposition apparatus 12 of FIG. 6 may include the slide member 212 having a shape protruding downwardly and bent inwardly and the guide rail 302 having a shape protruding upwardly and bent outwardly. This arrangement may prevent the effusion cell 200 from shaking vertically or from being separated from the guide rail 302.

Figure 7:
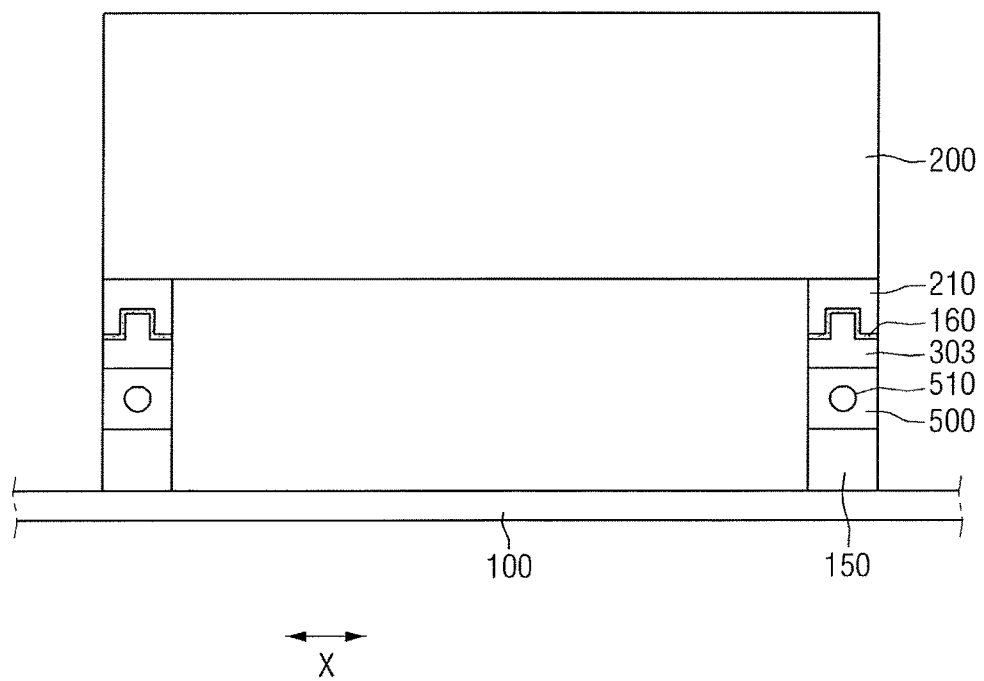
FIG. 7 illustrates another embodiment of a deposition apparatus.

FIG. 7 is a cross-sectional view of another embodiment of a deposition apparatus 13 which is different from the deposition apparatus 10 of FIG. 4, in that a cooler 500 including a cooling channel 510 is between a guide rail 303 and a support member 150. The cooler 500 may support a lower portion of the guide rail 303 and may contact the entire area of a lower surface of the guide rail 303. The cooler 500 may include the cooling channel 510, which is an internal portion filled with refrigerant. The cooler 500, itself, may contain a material having high thermal conductivity and, for example, may contain a metal or the same material as that of the guide rail 303.

For example, unlike the deposition apparatus of FIG. 4, in which the cooling channel 320 is in the interior of the guide rail 300, the cooler 500 including the cooling channel 510 may be on the lower portion of the guide rail 303 and thus may be a member separate from the guide rail 303. As a result, an increase in temperature of the guide rail 303 and the lubricating surface may be restrained.

Since the cooler 500 is on the lower portion of a general guide rail 303, which does not include a cooling channel to cool the guide rail 303, line modification costs may be reduced.

Figure 8:
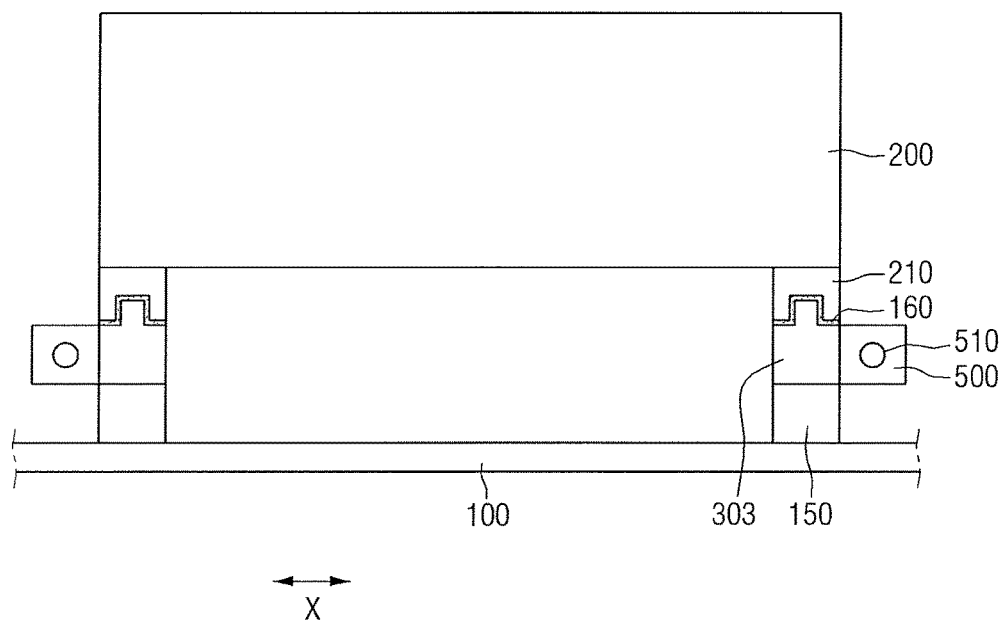
FIG. 8 illustrates another embodiment of a deposition apparatus.

FIG. 8 is a cross-sectional view of another embodiment of a deposition apparatus 14. In this embodiment, the cooler 500 including the cooling channel 510 is at a side surface of the guide rail 303. Since the cooler 500 is at a side portion of guide rail 303, which does not have a cooling channel to cool the guide rail 303, line modification costs may be reduced. In addition, the cooler 500 may be attached to the existing guide rail 300, without separating the guide rail 300 from the support member 150, thereby allowing for simple installation.

Figure 9:
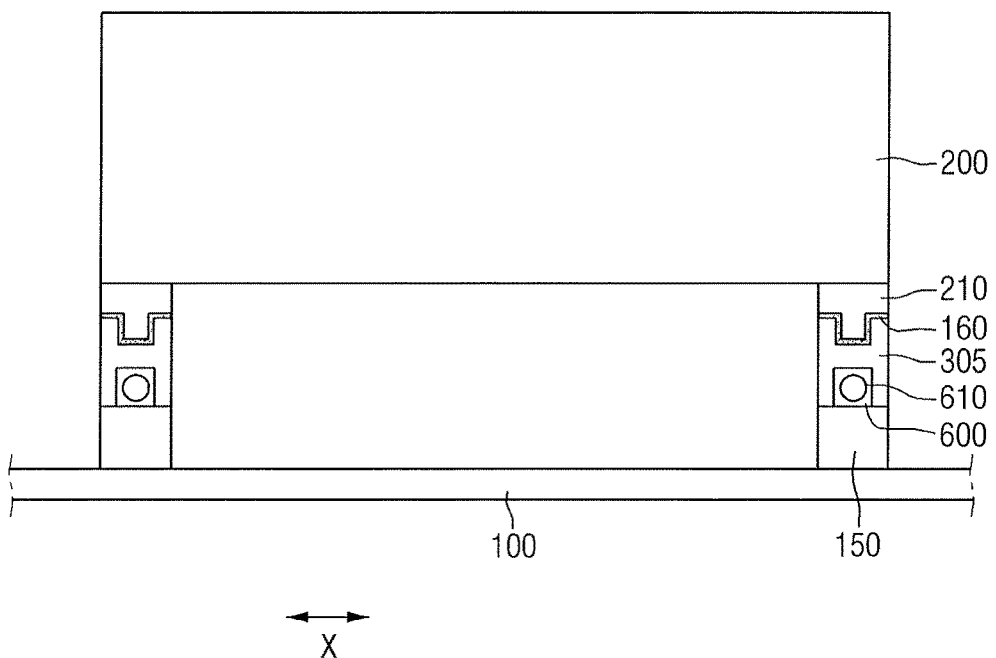
FIG. 9 illustrates another embodiment of a deposition apparatus.

FIG. 9 is a cross-sectional view of another embodiment of a deposition apparatus 15 that is different from the foregoing embodiments, in that a recess is in a lower surface of a guide rail 305 and a cooler 600 is in the recess. The cooler 600 may be on the support member 150 positioned therebelow. An upper surface and side surfaces of the cooler 600 may be surrounded by the recess recessed upwardly from the lower surface of the guide rail 305. Like the embodiment of FIG. 7, the cooling channel may be in the interior of the cooler 600.

Since the cooler 600 is surrounded by the recess in the lower surface of guide rail 305, the cooler 600 may be stably coupled to the guide rail 305. Also, the contact area between the cooler 600 and the guide rail 305 may be increased, thereby improving cooling efficiency.

Figure 10:
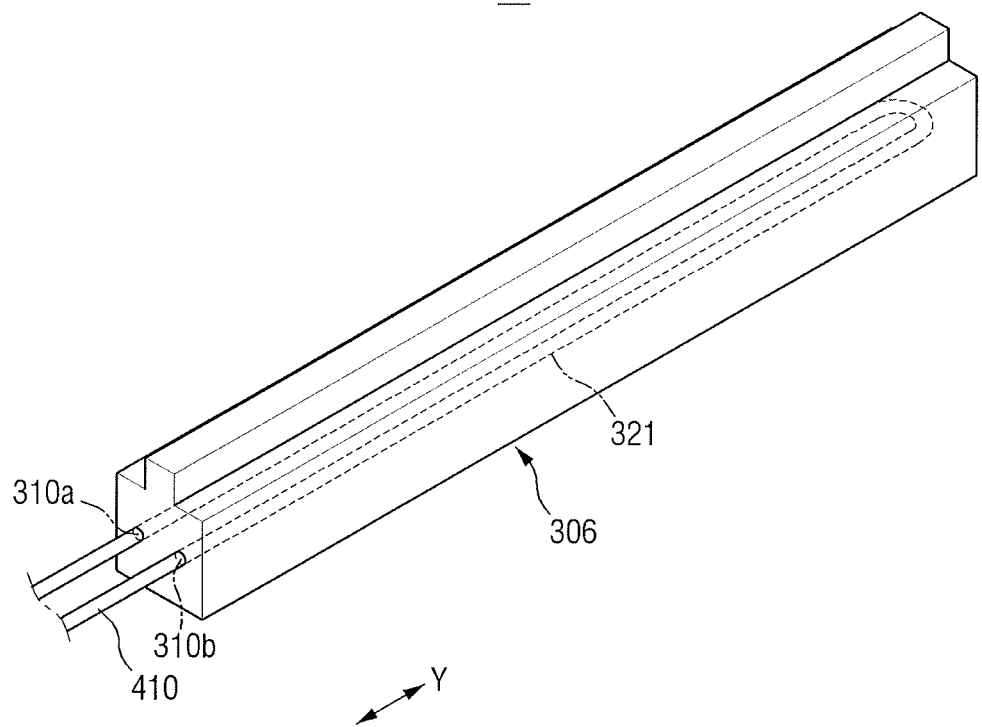
FIG. 10 illustrates another embodiment of a deposition apparatus.

FIG. 10 is a perspective view of another embodiment of a deposition apparatus 20 that is different from the embodiment of FIG. 2, in that all of the first opening 310a, through which refrigerant is introduced into a guide rail 306 from the outside and the second opening 310b through which refrigerant having passed through an internal portion of the guide rail 306 is discharged to the outside, is disposed at one end of the guide rail 306. A cooling channel 321, connecting the first opening 310a and the second opening 310b to each other, may be installed so that the cooling channel 321 traverses the interior of the guide rail 306 and shuttles between the openings.

For example, after the cooling channel 321 traverses the interior of the guide rail 306 from the first opening 310a in a first surface of the guide rail 306 toward a second surface of the guide rail 306 in the second direction Y, the cooling channel 321 may bend and traverse the interior of the guide rail 306 toward the first surface of the guide rail 306 to reach the second opening 310b. In the exemplary embodiment, since the length of the cooling channel 321 may be increased, a further increased amount of refrigerant may be in the guide rail 306. Thus, the refrigerant flowing in the cooling channel 321 may perform sufficient heat exchange with the guide rail 306, to thereby improve cooling efficiency.

The first opening 310a through which cooled refrigerant is introduced may be at a position higher than the second opening 310b through which the refrigerant having absorbed heat is discharged. Thus, a first extension portion of the cooling channel 321 extending from the first opening 310a to the other surface of the guide rail 306 may be at a position higher than a second extension portion of the cooling channel 321, traversing the interior of the guide rail 306 toward the first surface of the guide rail 306 to the second opening 310b.

In another exemplary embodiment, the first opening 310a and the second opening 310b may be at the same height. In this case, the first extension portion and the second extension portion of the cooling channel 321 may be at the same height.

Figure 11:
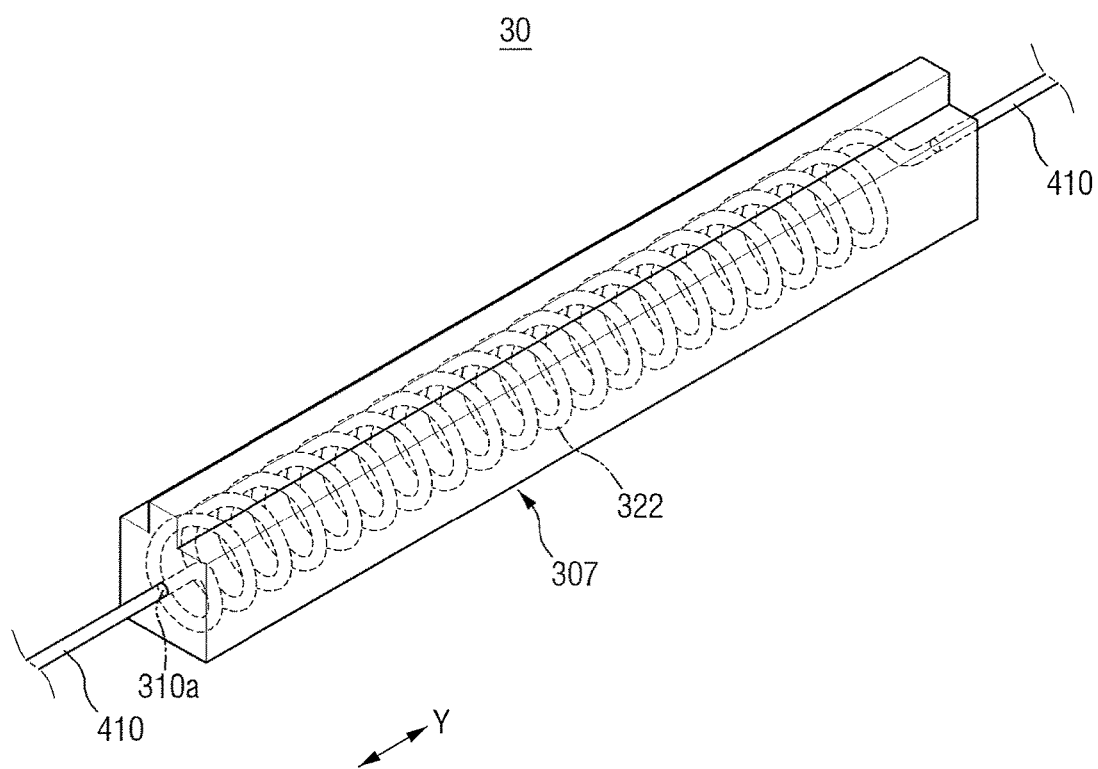
FIG. 11 illustrates another embodiment of a deposition apparatus.

FIG. 11 is a view of another embodiment of a deposition apparatus 30 which includes a cooling channel 322 of a guide rail 307 having a helical shape. The cooling channel 322 may extend in a helical shape in the second direction Y in the interior of a guide rail 307. Accordingly, the length of the cooling channel 322 in the guide rail 307 may be increased. Also, since the cooling channel 321 has a helical shape, the length of the cooling channel 322 may be increased. Thus, refrigerant flowing in the cooling channel 322 may perform sufficient heat exchange with the guide rail 307, to thereby improve cooling efficiency.

By way of summation and review, an OLED display may be fabricated using various deposition methods based on a gas reaction. For example, the organic layer of an OLED display may be formed using a vacuum deposition method, which involves depositing an organic material on a substrate by evaporation in a vacuum. The organic material may be effusion cell sprayed onto the substrate. The effusion cell may include a crucible that receives an organic material and a heating element for heating the crucible.

In an attempt to form substrates of increased size and organic layers with good step coverage and uniformity, the effusion cell may be used to provide organic gaseous material. This material may be formed by evaporating organic material on the substrate held in a stationary state. The effusion cell may move in a vacuum chamber relative to the substrate. A guide rail may be installed to guide movement of the effusion cell, and the slide member may move along the guide rail.

Grease may be used to reduce friction between the guide rail and slide member. However, when the grease is heated during evaporation of the organic material and when the slide member moves, the evaporation gas may be contaminated in the chamber by the heated grease. The contaminated gas may reduce the lifespan of the OLED display. In addition, the requirement to resupply the grease causes delays and inefficiencies in the manufacturing process.

In accordance with one or more of the aforementioned embodiments, Asa deposition apparatus is provided which reduces or prevents the generation of heat and evaporation of grease by cooling the guide rail.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the invention as set forth in the following claims.

What is claimed is:

1. A method for depositing an organic material, the method comprising:
   providing an effusion cell, extending in a first direction, on a guide rail extending in a second direction intersecting the first direction;
   supplying a refrigerant to a cooling channel adjacent to an upper surface of the guide rail; and
   moving the effusion cell on the guide rail.

2. The method as claimed in claim 1, wherein moving the effusion cell includes moving the effusion cell while a deposition material is evaporated from the effusion cell.

3. The method as claimed in claim 1, wherein moving the effusion cell includes moving the effusion cell while the refrigerant continuously flows in the cooling channel.

4. The method as claimed in claim 1, wherein the guide rail includes a lubricating surface.

5. The method as claimed in claim 4, wherein the lubricating surface includes an organic material containing fluoride.

6. The method as claimed in claim 1, wherein the cooling channel is in an interior of the guide rail.

7. The method as claimed in claim 1, wherein the cooling channel is in a cooler below the guide rail or at a side portion of the guide rail.

8. The method as claimed in claim 1, wherein the cooling channel has a substantially helical shape.

9. A method for depositing an organic material, the method comprising:
   providing an effusion cell, extending in a first direction, on a guide rail extending in a second direction intersecting the first direction;
   supplying a refrigerant to a cooling channel adjacent to an upper surface of the guide rail; and
   moving the effusion cell on the guide rail, wherein the guide rail includes a lubricating surface located between the cooling channel and the effusion cell.

* * * * *